(12) United States Patent
Katsuyama

(10) Patent No.: US 7,678,594 B2
(45) Date of Patent: Mar. 16, 2010

(54) INTEGRATED OPTICAL DEVICE AND FABRICATION METHOD THEREOF

(75) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 331 days.

(21) Appl. No.: 11/806,067

(22) Filed: May 29, 2007

(65) Prior Publication Data

US 2008/0003704 A1    Jan. 3, 2008

(30) Foreign Application Priority Data

Jun. 2, 2006    (JP)    ............................. 2006-155089

(51) Int. Cl.
*H01L 21/00* (2006.01)
(52) U.S. Cl. ............................... 438/29; 438/39; 438/46
(58) Field of Classification Search .................. 438/29, 438/31, 32, 39, 42, 46, 47, 93; 257/79, 80, 257/84, 85, 94, 95, 96
See application file for complete search history.

(56) References Cited

U.S. PATENT DOCUMENTS

| 5,119,393 | A | * | 6/1992 | Oka et al. | ................. 372/50.22 |
| 5,140,149 | A | * | 8/1992 | Sakata et al. | ................. 257/436 |
| 5,661,318 | A | * | 8/1997 | Nashimoto | ................. 257/279 |
| 2004/0179569 | A1 | * | 9/2004 | Sato et al. | ...................... 372/50 |

FOREIGN PATENT DOCUMENTS

JP    7-263655    10/1995

* cited by examiner

*Primary Examiner*—Kevin M Picardat
(74) *Attorney, Agent, or Firm*—Smith, Gambrell & Russell, LLP

(57) ABSTRACT

An integrated optical device comprising a first semiconductor optical element provided on a first region of the main face of a substrate and a second semiconductor optical element provided on a second region and optically coupled to the first semiconductor optical element is fabricated. A first III-V compound semiconductor layer containing Al element is formed on the main face. A second III-V compound semiconductor layer for forming the first semiconductor optical element is then formed on the first III-V compound semiconductor layer. An etching mask M is formed on the first region. The end point of the dry etching is detected by using the etching mask M to dry-etch the second III-V compound semiconductor layer while detecting Al element. The first semiconductor optical element is thus formed. The second semiconductor optical element is formed on the second region.

5 Claims, 8 Drawing Sheets

(a)

(b)

(a)

(b)

(a)

(b)

(a)

(b)

(a)

(b)

INTEGRATED OPTICAL DEVICE AND FABRICATION METHOD THEREOF

BACKGROUND OF THE INVENTION

1. Field of the Invention

The present invention relates to an integrated optical device and a fabrication method thereof.

2. Related Background Art

Integrated optical devices that have a semiconductor laser and an optical modulator that is optically coupled to the semiconductor laser provided on a substrate are known (See Japanese Application Laid Open No. H7-263655). Structures for implementing this optical coupling include Butt joint structures. This type of structure is formed as follows. First, an n-type cladding layer, an active layer and p-type cladding layer are formed on a substrate. Thereafter, an etching mask is formed on a p-type cladding layer in a region for forming a semiconductor laser. The n-type cladding layer, active layer and p-type cladding layer in a region for forming an optical modulator are then removed by means of dry etching by using the etching mask. Thereafter, an n-type cladding layer, absorption layer, and p-type cladding layer are grown in a region for forming an optical modulator.

However, the above method makes it difficult to control the etching depth when dry-etching the n-type cladding layer, active layer, and p-type cladding layer. As a result, the fluctuations in the etching depth between lots when fabricating the integrated optical device increase. Hence, the thickness of the n-type cladding layer formed in the region for forming the optical modulator must be adjusted again. In addition, when the fluctuations in the etching depth are large, it is difficult to match the height position of the absorption layer of the optical modulator with the height position of the active layer of the semiconductor laser. As a result, the optical coupling efficiency of the semiconductor laser and optical modulator is reduced.

Therefore, an object of the present invention is to provide a method of fabricating an integrated optical device that allows the etching depth to be controlled and an integrated optical device with a high coupling efficiency.

SUMMARY OF THE INVENTION

In order to achieve the above problem, the method of fabricating the integrated optical device of the present invention is a fabrication method for an integrated optical device having a first semiconductor optical element that is provided on a first region of the main face of a substrate and a second semiconductor optical element that is provided on a second region of the main face of the substrate and that is optically coupled to the first semiconductor optical element, comprising the steps of: forming a first III-V compound semiconductor layer containing Al element on the main face of the substrate; forming a second III-V compound semiconductor layer for forming the first semiconductor optical element on the first III-V compound semiconductor layer; forming an etching mask on the first region after forming the second III-V compound semiconductor layer; forming the first semiconductor optical element by using the etching mask to dry-etch the second III-V compound semiconductor layer; and forming the second semiconductor optical element on the second region after forming the first semiconductor optical element, wherein, in the step of forming the first semiconductor optical element, the end point of the dry etching is detected by performing dry etching while detecting Al element.

In the case of the fabrication method of the integrated optical device of the present invention, because the first III-V compound semiconductor layer contains Al element, the end point of the dry etching can be detected by detecting Al element when dry-etching the second III-V compound semiconductor layer. The etching depth can accordingly be controlled.

In addition, in the step of forming the first semiconductor optical element, Al element is preferably detected by using the plasma emission spectra. As a result, Al element can be detected without affecting the plasma state when performing the dry etching.

The integrated optical device fabrication method preferably further comprises the step of wet-etching the first III-V compound semiconductor layer using the etching mask before forming the second semiconductor optical element after forming the first semiconductor optical element.

In this case, the etching depth can be made substantially equal to the total thickness of the first III-V compound semiconductor layer and second III-V compound semiconductor layer.

Furthermore, in the step of wet-etching the first III-V compound semiconductor layer, a side etch is preferably formed in the first III-V compound semiconductor layer.

If a side etch is formed, it is possible to suppress the anomalous growth in an upward direction of crystals which are contained in the second semiconductor optical element along the side wall of the first semiconductor optical element when forming the second semiconductor optical element. As a result, because the second semiconductor optical element is suitably optically coupled to the first semiconductor optical element, the coupling efficiency improves.

In addition, the substrate preferably contains InP and the first III-V compound semiconductor layer preferably contains $In_xAl_{1-x}As$ ($0 \leq x \leq 1$).

In this case, when the first III-V compound semiconductor layer is etched, it is possible to selectively etch the first III-V compound semiconductor layer with respect to the substrate by using an etchant of high selectivity (the ratio between the etching speed of InP and the etching speed of $In_xAl_{1-x}As$). Accordingly, the etching depth can be suppressed highly accurately. Such etchants include an etchant that contains citric acid, for example.

The first III-V compound semiconductor layer is preferably provided with a diffraction grating.

In this case, because a diffraction grating can be formed over the whole of the main face of the substrate, the selective growth of the etching mask and first III-V compound semiconductor layer is not required. In addition, because a diffraction grating is formed before forming the first semiconductor optical element, there is no need to remove, through detachment, the first semiconductor optical element even when the formation of the diffraction grating fails.

The integrated optical device of the present invention comprises a first semiconductor optical element that is provided on a first region of the main face of the substrate, a second semiconductor optical element that is provided on a second region of the main face of the substrate and that is optically coupled to the first semiconductor optical element, and a III-V compound semiconductor layer that is provided between the substrate and the first semiconductor optical element, and that contains Al element, wherein the III-V compound semiconductor layer is provided with a diffraction grating.

In the case of the integrated optical device of the present invention, because the height position of the second semiconductor optical element is easily matched with the height position of the first semiconductor optical element during fabrication, the optical coupling efficiency between the first semiconductor optical element and second semiconductor optical element can be improved.

The present invention will be more fully understood from the detailed description given hereinbelow and the accompanying drawings, which are given by way of illustration only and are not to be considered as limiting the present invention.

Further, the scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
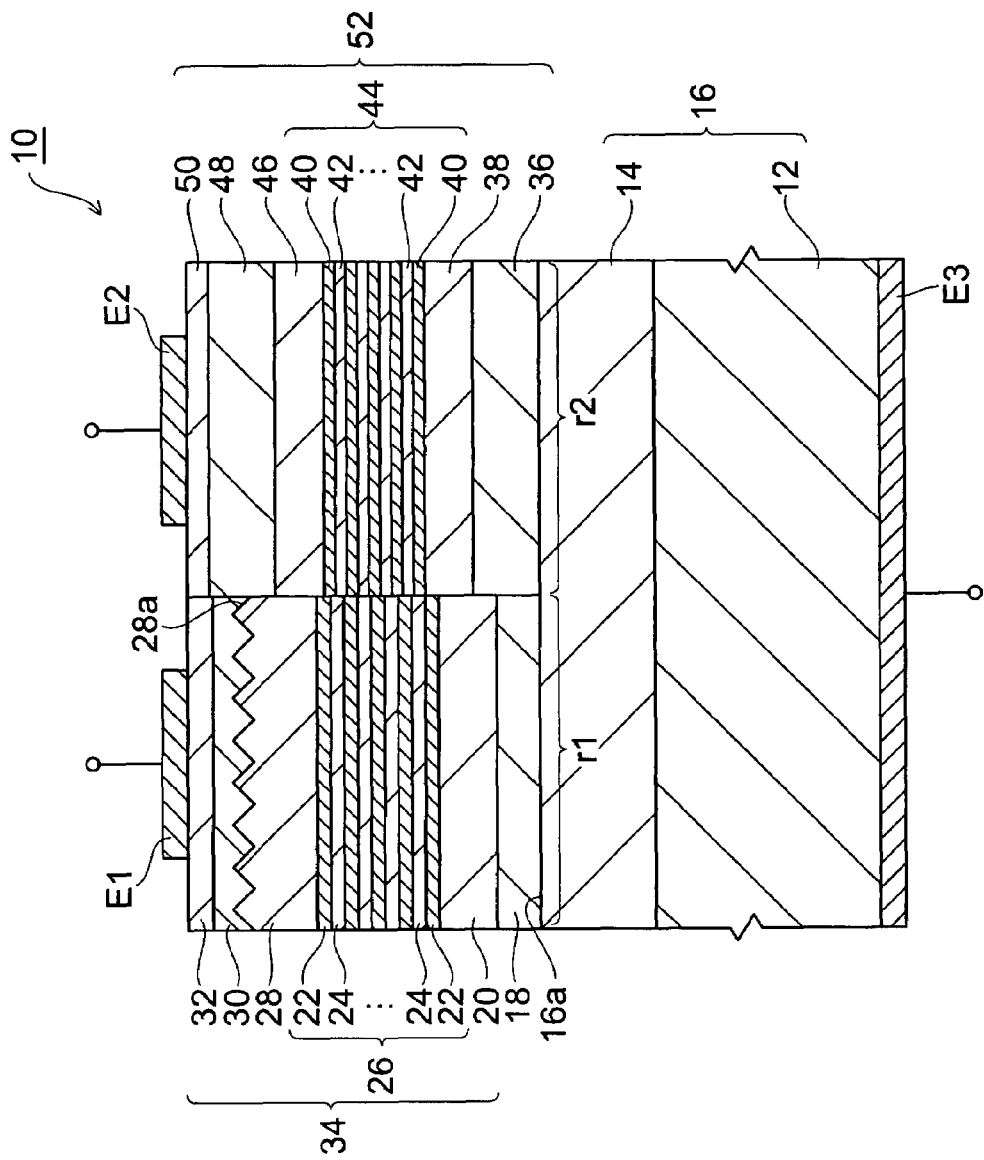
FIG. 1 is a cross-sectional view that schematically shows an example of an integrated optical device according to a first embodiment.

An embodiment of the present invention will be described in detail hereinbelow with reference to the attached drawings. In the description of the drawings, the same reference numerals are used for the same or equal elements, thereby avoiding repetition in the description.

FIG. 1 is a cross-sectional view that schematically shows an example of an integrated optical device according to the first embodiment. The integrated optical device 10 shown in FIG. 1 comprises a first semiconductor optical element 34 that is provided on a first region r1 of a main face 16a of a substrate 16 and a second semiconductor optical element 52 that is provided on a second region r2 of the main face 16a of substrate 16. The semiconductor optical element 52 is optically coupled to semiconductor optical element 34. Therefore, the integrated optical device 10 has a butt joint structure. Further, a III-V compound semiconductor layer 18 including Al element is provided between substrate 16 and the semiconductor optical element 34. Electrodes E1 and E2 are each provided on the semiconductor optical element 34 and semiconductor optical element 52. An electrode E3 is provided on the underside of the substrate 16.

Substrate 16 comprises a substrate main body 12 and a buffer layer 14 which is provided on the substrate main body 12. Substrate 16 consists of InP, for example. Substrate 16 may also be constituted comprising a III-V compound semiconductor other than InP. In an example, the substrate main body 12 consists of an Sn-doped n-type InP. Further, in an example, the buffer layer 14 consists of an Si-doped n-type InP and the thickness of the buffer layer 14 is 550 nm and the carrier density of the buffer layer 14 is $1.1 \times 10^{18}$ cm$^3$.

The semiconductor optical element 34 comprises an optical confinement layer 20, an active layer 26, an optical confinement layer 28, a cladding layer 30, and a cap layer 32, which are provided sequentially on the III-V compound semiconductor layer 18. The semiconductor optical element 34 is preferably a semiconductor laser, an optical amplifier or an optical modulator. Semiconductor lasers include a distributed-feedback semiconductor laser (known as a 'DFB semiconductor laser' hereinbelow), for example. Optical amplifiers include, for example, a semiconductor optical amplifier (Semiconductor Optical Amplifier: SOA) or the like. Optical modulators include, for example, an electric absorption-type optical modulator ('EA optical modulator' hereinbelow). The semiconductor optical element 34 of this embodiment is a DFB semiconductor laser.

Both optical confinement layers 20 and 28 are separate confinement heterostructure (SCH) layers, for example. The optical confinement layers 20 and 28 both preferably consist of a GaInAsP material. In an example, conversion of the bandgap energy of the optical confinement layers 20 and 28 into an optical wavelength yields 1150 nm in both cases and the thickness of the optical confinement layers 20 and 28 is 100 nm in both cases. In this embodiment, a diffraction grating 28a is provided in the optical confinement layer 28.

The active layer 26 preferably has a multiple quantum well (MQW) structure in which a plurality of barrier layers 22 and a plurality of well layers 24 are alternately arranged. The active layer 26 preferably contains GaInAsP. In an example, conversion of the bandgap energy of the barrier layer 22 into an optical wavelength yields 1200 nm and the thickness of the barrier layer 22 is 10 nm. Further, in an example, conversion of the bandgap energy of the well layer 24 into an optical wavelength is 1550 nm and the thickness of the well layer 24 is 5 nm. The well layer 24 receives a compression strain of 1%.

The cladding layer 30 consists of a Zn-doped p-type InP, for example. In an example, the thickness of the cladding layer 30 is 240 nm and the carrier density of the cladding layer 30 is $6.5 \times 10^{17}$ cm$^{-3}$.

The cap layer 32 consists of Zn-doped p-type InGaAs, for example. In an example, the thickness of the cap layer 32 is 100 nm and the carrier density of the cap layer 32 is $2.0 \times 10^{17}$ cm$^{-3}$.

The semiconductor optical element 52 comprises a buffer layer 36, an optical confinement layer 38, an active layer 44, an optical confinement layer 46, a cladding layer 48, and a cap layer 50, which are sequentially provided on substrate 16. The semiconductor optical element 52 is preferably a semiconductor laser, an optical amplifier, or an optical modulator. In this embodiment, the semiconductor optical element 52 is an EA optical modulator. In this case, the active layer 44 is able to absorb light that is radiated by the active layer 26, for example.

The buffer layer 36 consists of an Si-doped n-type InP, for example. In an example, the thickness of the buffer layer 36 is 50 nm and the carrier density of the buffer layer 36 is $6.5 \times 10^{17}$ cm$^{-3}$. The cladding layer 48 consists of a Zn-doped p-type InP, for example. In an example, the thickness of the cladding layer 48 is 100 nm and the carrier density of the cladding layer 48 is 6.5×10$^{17}$ cm$^{-3}$.

The optical confinement layers 38 and 46 both preferably consist of GaInAsP material. In an example, conversion of the bandgap energy of the optical confinement layers 38 and 46 to an optical wavelength is also 1400 nm and the thickness of both optical confinement layers 38 and 46 is 10 nm.

The active layer 44 preferably has a quantum well structure in which a plurality of barrier layers 40 and a plurality of well layers 42 are alternately arranged. The active layer 44 preferably contains GaInAsP. In an example, conversion of the bandgap energy of the barrier layer 40 into an optical wavelength yields 1400 nm and the thickness of the barrier layer 40 is 10 nm. Further, in an example, conversion of the bandgap energy of the well layer 42 into an optical wavelength is 1500 nm and the thickness of the well layer 42 is 6 nm. The well layer 42 receives a compression strain of 1%.

The constituent material of the III-V compound semiconductor layer 18 differs from the constituent material of the optical confinement layer 20. The III-V compound semiconductor layer 18 may also comprise at least one of the In, Ga, P and As in addition to Al. The III-V compound semiconductor layer 18 preferably contains In$_x$Al$_{1-x}$As (0≦x≦1). In cases where the In composition x is 0.52, the InP and In$_{0.52}$Al$_{0.48}$As have the same lattice constant. In this case, the bandgap energy of the In$_{0.52}$Al$_{0.48}$As is greater than the bandgap energy of InP. Further, the bandgap energy of the III-V compound semiconductor layer 18 is preferably greater than the bandgap energy of the optical confinement layer 20. In such a case, the III-V compound semiconductor layer 18 has an adverse effect on the optical confinement characteristic of the optical confinement layer 20. In an example, the III-V compound semiconductor layer 18 consists of an Si-doped n-type In$_{0.52}$Al$_{0.48}$As and the thickness of the III-V compound semiconductor layer 18 is 50 nm. The carrier density of the III-V compound semiconductor layer 18 is 1.1×10$^{18}$ cm$^{-3}$.

Figure 2:
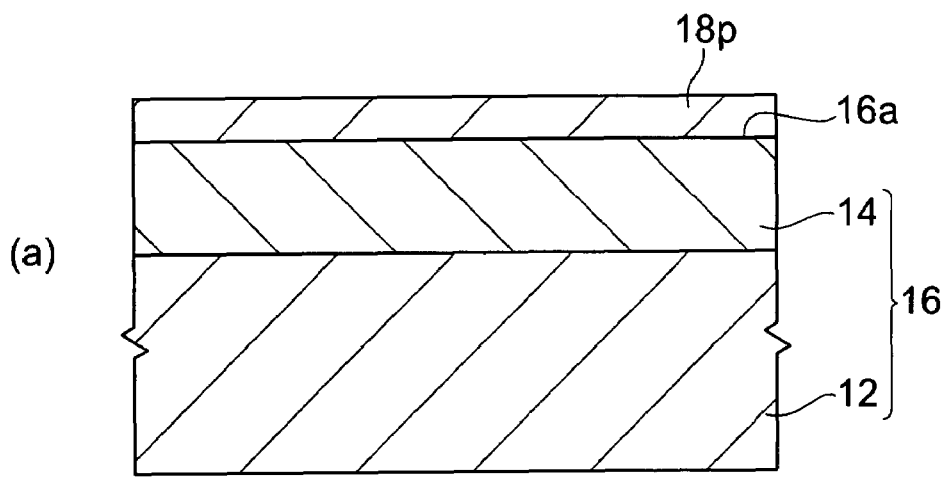
FIG. 2 is a cross-sectional view that schematically shows the respective steps of a method of fabricating an integrated optical device according to the first embodiment.
Figure 2:
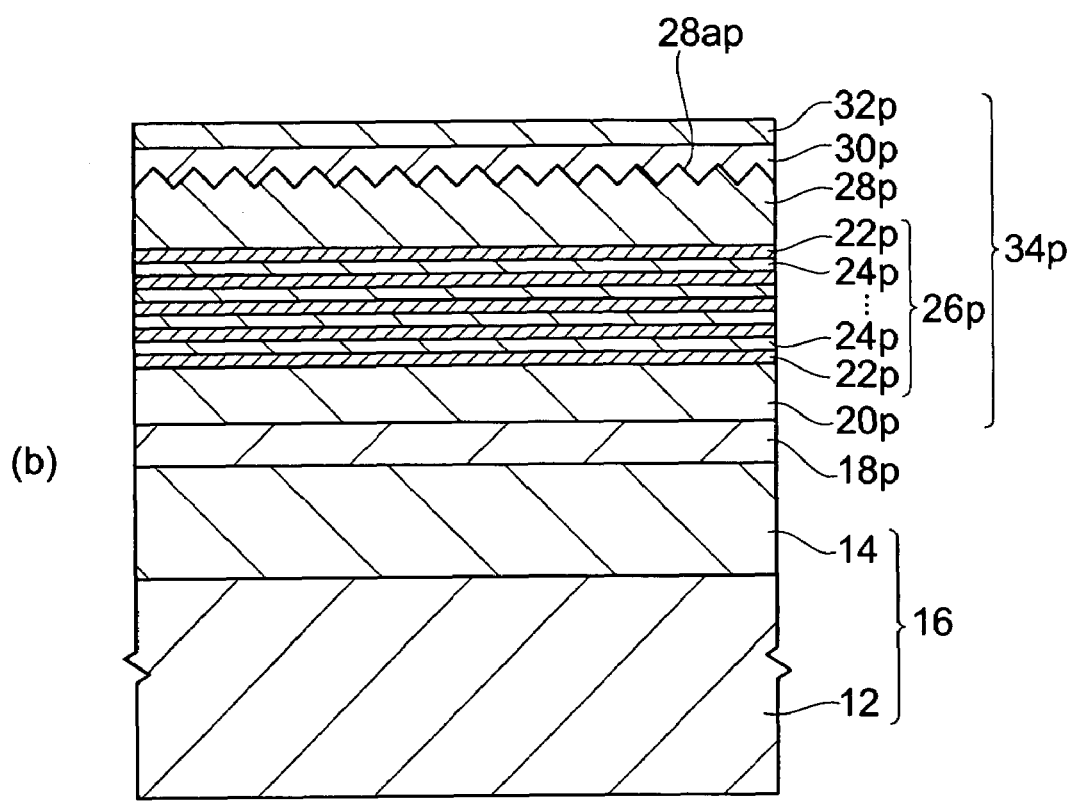
Figure 3:
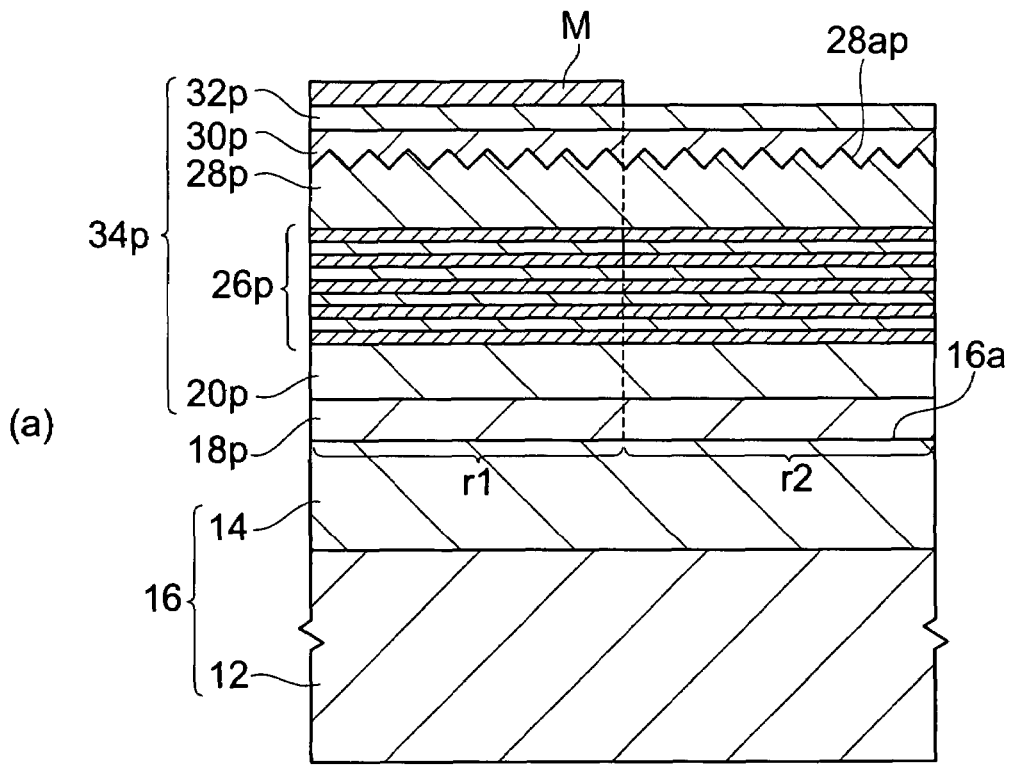
FIG. 3 is a cross-sectional view that schematically shows the respective steps of the method of fabricating an integrated optical device according to the first embodiment.
Figure 3:
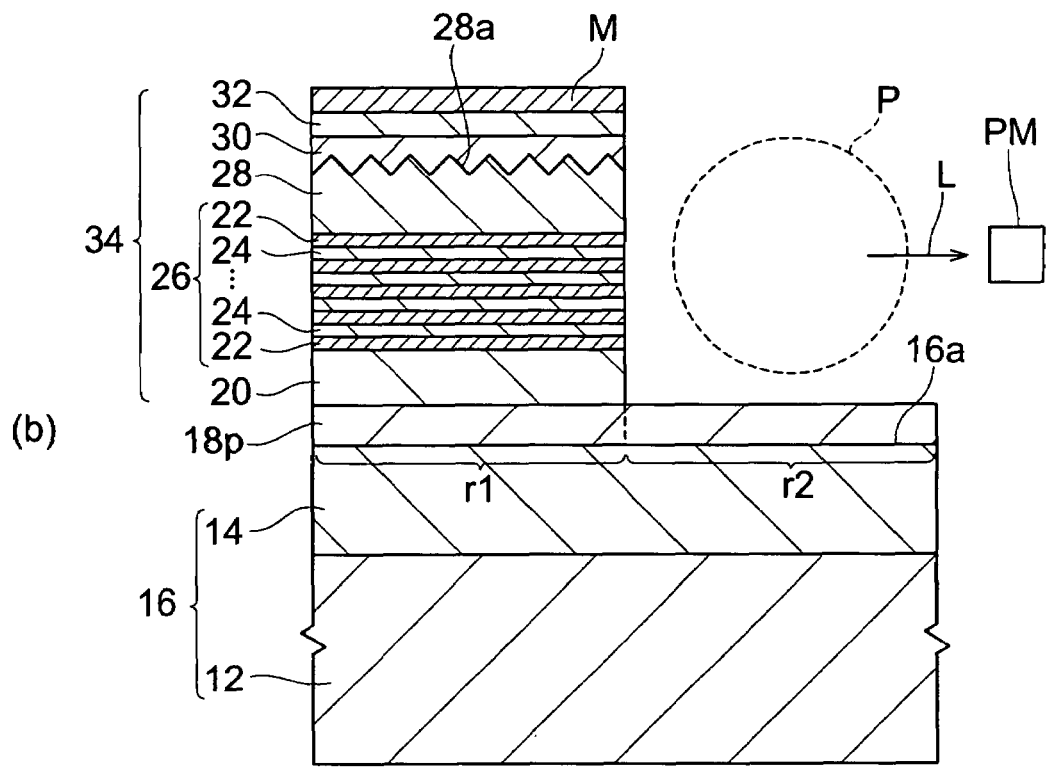
Figure 4:
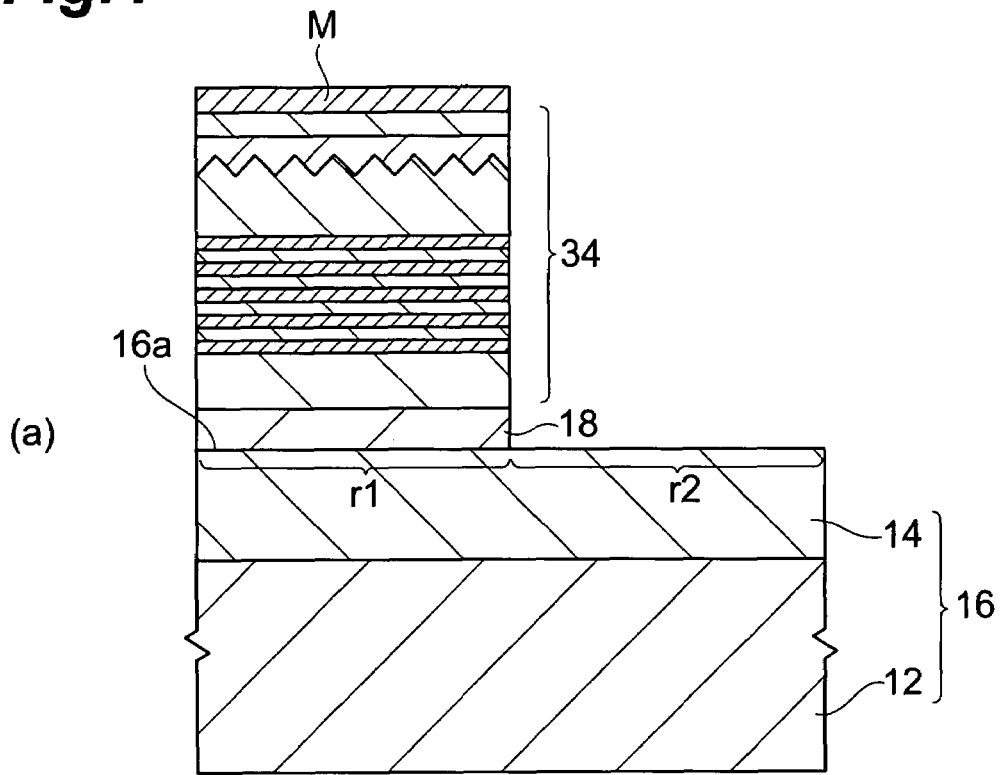
FIG. 4 is a cross-sectional view that schematically shows the respective steps of the method of fabricating an integrated optical device according to the first embodiment.
Figure 4:
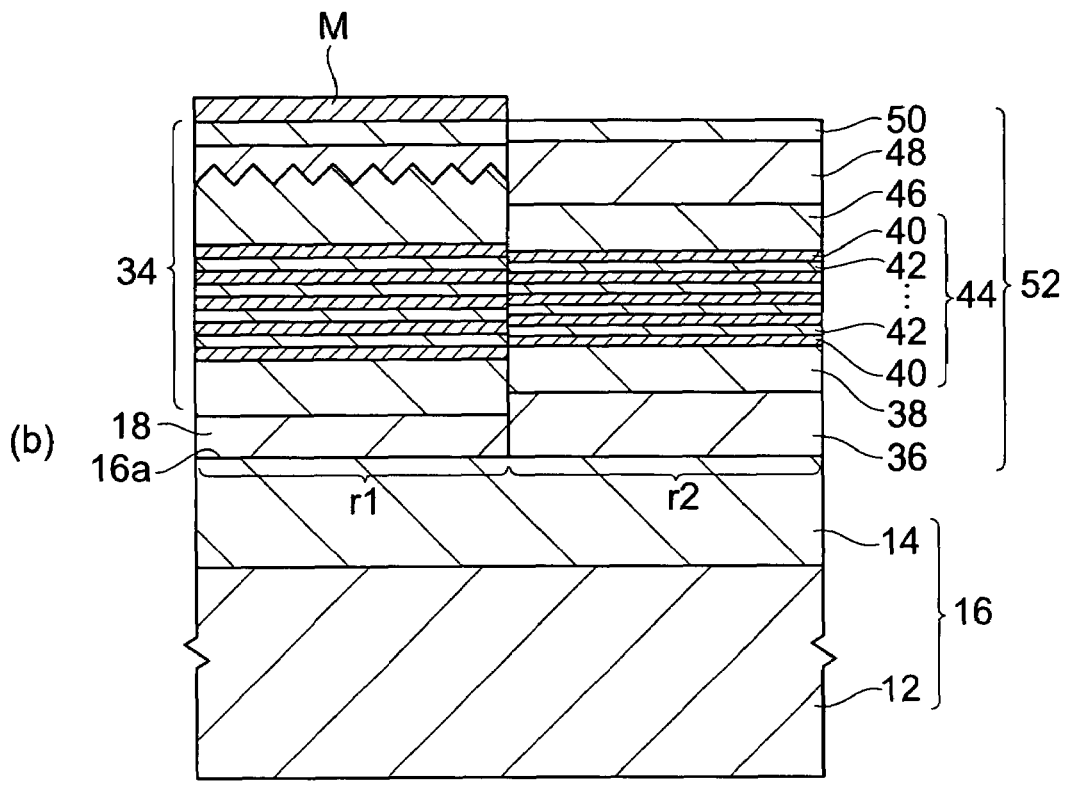

FIGS. 2 to 4 are both cross-sectional views that schematically show the respective steps of the method of fabricating an integrated optical device of the first embodiment. The method of fabricating the integrated optical device 10 will be described as an example of the method of fabricating the integrated optical device of this embodiment. The integrated optical device 10 is suitably fabricated as a result of undergoing each of the following steps.

First, as shown in (a) of FIG. 2, a first III-V compound semiconductor layer 18p is formed on the main face 16a of the substrate 16. The III-V compound semiconductor layer 18p is for forming the above III-V compound semiconductor layer 18. The III-V compound semiconductor layer 18p preferably undergoes epitaxial growth by using a vapor growth method. The MOVPE method is suitable as the vapor growth method.

Thereafter, as shown in (b) of FIG. 2, a second III-V compound semiconductor layer 34p for forming the semiconductor optical element 34 is formed on the III-V compound semiconductor layer 18p. In this case, the III-V compound semiconductor layer 18p and III-V compound semiconductor layer 34p can be grown together. The constituent material of the III-V compound semiconductor layer 34p differs from the constituent material of the III-V compound semiconductor layer 18p. The III-V compound semiconductor layer 34p is preferably grown epitaxially by using the vapor growth method. The III-V compound semiconductor layer 34p is formed as follows, for example. The following layers are grown on the III-V compound semiconductor layer 18p in the same order: a III-V compound semiconductor layer 20p, a III-V compound semiconductor layer 26p, a III-V compound semiconductor layer 28p, a III-V compound semiconductor layer 30p, and a III-V compound semiconductor layer 32p. The III-V compound semiconductor layer 20p, III-V compound semiconductor layer 26p, a III-V compound semiconductor layer 28p, a III-V compound semiconductor layer 30p, and a III-V compound semiconductor layer 32p each form the optical confinement layer 20, active layer 26, optical confinement layer 28, cladding layer 30, and cap layer 32.

The III-V compound semiconductor layer 26p is formed as follows, for example. A plurality of layers are alternately formed on the III-V compound semiconductor layer 20p: a III-V compound semiconductor layer 22p for forming the barrier layer 22 and the III-V compound semiconductor layer 24p for forming the above quantum well layer 24.

A diffraction grating 28ap for forming the diffraction grating 28a is formed on the III-V compound semiconductor layer 28p. The diffraction grating 28ap is formed by etching the surface of the III-V compound semiconductor layer, for example. Normally, after growing the III-V compound semiconductor layer which is the parent body of the III-V compound semiconductor layer 28p, the diffraction grating 28ap is formed, whereupon the III-V compound semiconductor layers 30p and 32p are sequentially grown.

Thereafter, as shown in (a) of FIG. 3, an etching mask M is formed on first region r1 of the main face 16a of substrate 16. The etching mask M is formed on the III-V compound semiconductor layer 34p. The etching mask M is formed by patterning an insulating layer by using photolithography, for example. The etching mask M consists of SiO$_2$ and the thickness of the etching mask M is 200 nm.

Thereafter, as shown in (b) of FIG. 3, the semiconductor optical element 34 is formed by using etching mask M to dry-etch the III-V compound semiconductor layer 34p by means of plasma P. Reactive ion etching (RIE) is preferable as the dry etching method. As the etching gas, a mixed gas of CH$_4$ gas and H$_2$ gas or HBr gas or the like can be suitably used, for example. When HBr gas is employed, because GaInAsP can be selectively dry-etched with respect to the InAlAs, the III-V compound semiconductor layer 18p can constitute an etching stop layer. In an example, the flow amounts of the CH$_4$ gas and H$_2$ gas are both 25 sccm, the RF power is 100 W, and the etching depth is approximately 0.8 μm.

In this step, the end point of the dry etching is detected by performing dry-etching while detecting Al element in the plasma P. More specifically, the luminescence L of the plasma P is preferably dispersed using a plasma monitor PM and the plasma emission spectra thus obtained is used to detect Al element. For example, when Al element is detected, it is possible to judge that the end point of the dry etching has been reached. By using the plasma emission spectra, Al element can be detected without affecting the plasma state during dry etching.

Thereafter, as shown in (a) of FIG. 4, etching mask M is preferably used to wet-etch the III-V compound semiconductor layer 18p. As a result, the III-V compound semiconductor layer 18 is formed. In this case, the damaged region (a region of reduced crystallinity) of the III-V compound semiconductor layer 18p formed by dry-etching, for example, can be removed and the III-V compound semiconductor layer 18p can be etched so that there is no damage to the main face 16a of the substrate 16. As a result, the crystallinity of the constituent material of the semiconductor optical element 52 formed in the second semiconductor optical element formation step (described subsequently) can be improved.

Thereafter, as shown in (b) of FIG. 4, a semiconductor optical element 52 is formed on the second region r2 of the main face 16a of the substrate 16. The semiconductor optical element 52 is formed as follows, for example. Formed sequentially on second region r2 are the buffer layer 36, optical confinement layer 38, active layer 44, optical confinement layer 46, cladding layer 48, and cap layer 50. The active layer 44 is formed as follows, for example. Formed alternately on the optical confinement layer 38 are a plurality of barrier layers 40 and a plurality of well layers 42. The buffer layer 36, optical confinement layer 38, active layer 44, optical confinement layer 46, cladding layer 48, and cap layer 50 are preferably grown epitaxially by using the vapor growth method.

Thereafter, after the etching mask M is removed through detachment, electrodes E1 and E2 are each formed on the semiconductor optical element 34 and semiconductor optical element 52. Electrode E3 is provided on the underside of the substrate 16.

As mentioned above, the integrated optical device 10 is fabricated. With the fabrication method of this embodiment, because the III-V compound semiconductor layer 18p contains Al element, the end point of the dry etching can be detected by detecting Al element when dry-etching the III-V compound semiconductor layer 34p. Al element is detected by the plasma monitor PM, for example. Accordingly, the etching depth when etching the III-V compound semiconductor layer 34p can be controlled. Further, in cases where the III-V compound semiconductor layer 34p is grown using the MOVPE method, because the thickness of the III-V compound semiconductor layer 34p can be controlled highly accurately, the etching depth can also be controlled highly accurately. When the etching depth can be controlled, fluctuations in the etching depth between the lots when the integrated optical device 10 is fabricated can be reduced and, therefore, the fabrication yield can be improved.

When the fabrication method of this embodiment is used, the height position from the main face 16 of the active layer 44 is easily aligned with the height position from the main face 16 of the active layer 26. As a result, because the coupling efficiency of the light between the semiconductor optical element 34 and semiconductor optical element 52 can be improved, an integrated optical device 10 with a high coupling efficiency is obtained. In addition, because there is no need to perform level difference measurement before forming the semiconductor optical element 52, the fabrication steps for the integrated optical device 10 can be simplified and a reduction in the fabrication costs is possible.

In addition, because the III-V compound semiconductor layer 18p is wet-etched by using etching mask M, even when the III-V compound semiconductor layer 34p is over-etched, for example, the total etching depth can be substantially equated to the total thickness of the III-V compound semiconductor layer 18p and III-V compound semiconductor layer 34p. Further, by wet-etching the III-V compound semiconductor layer 18p, damage to the main face 16a of the substrate 16 can be suppressed.

In addition, the substrate 16 preferably contains InP and the III-V compound semiconductor layer 18p preferably contains $In_xAl_{1-x}As$ ($0 \leq x \leq 1$). In this case, when the III-V compound semiconductor layer 18p is etched, the III-V compound semiconductor layer 18p can be selectively etched by using an etchant of high selectivity (the ratio between the etching speed of InP and the etching speed of $In_xAl_{1-x}As$). Therefore, the III-V compound semiconductor layer 18p can be removed without etching as far as substrate 16 even when the etching time is not strictly managed. Such etchants include an etchant containing citric acid, for example.

Figure 5:
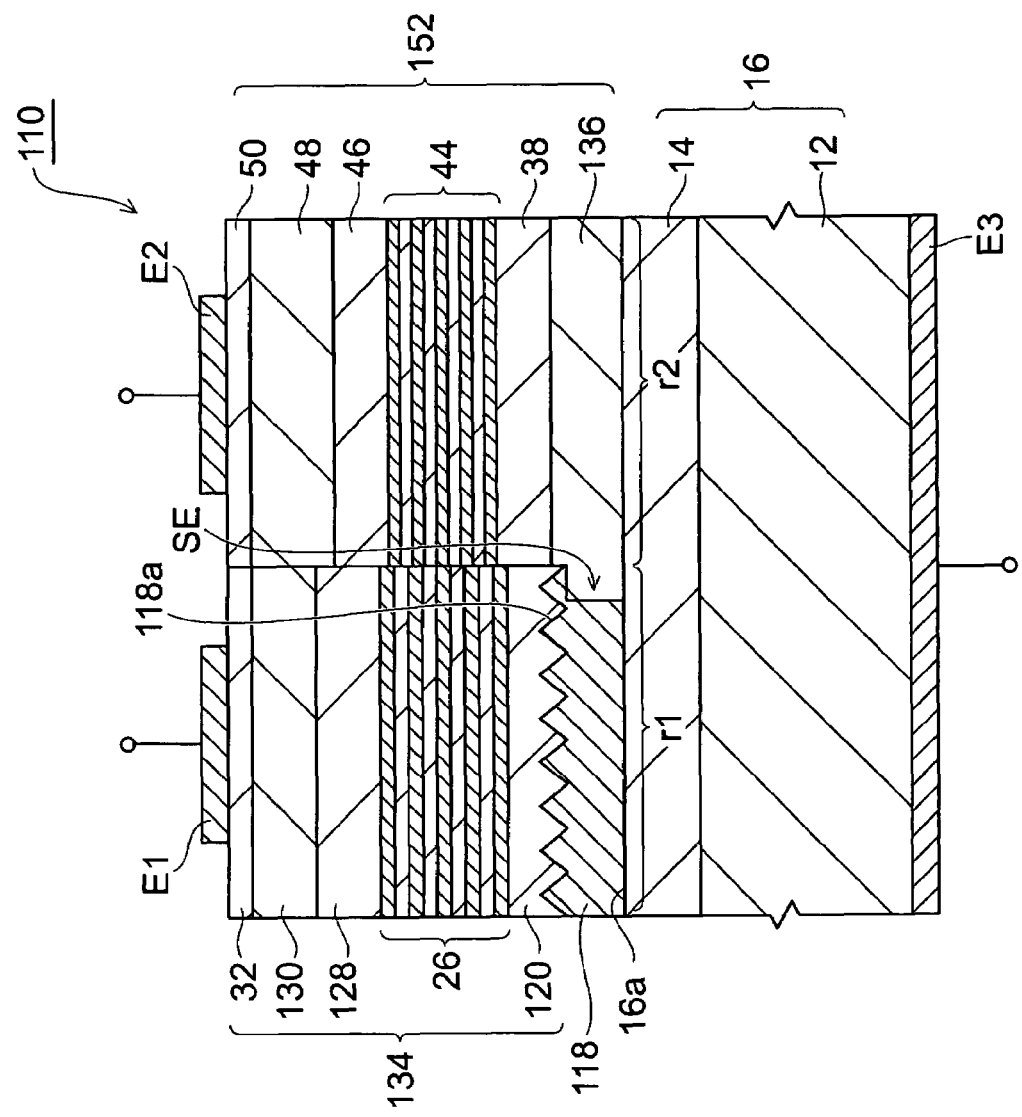
FIG. 5 is a cross-sectional view that schematically shows an example of an integrated optical device according to a second embodiment.

FIG. 5 is a cross-sectional view that schematically shows an example of an integrated optical device according to the second embodiment. The integrated optical device 110 shown in FIG. 5 comprises a first semiconductor optical element 134 that is provided on a first region r1 of main face 16a of the substrate 16 and a second semiconductor optical element 152 that is provided on a second region r2 of main face 16a of substrate 16. The semiconductor optical element 152 is optically coupled to the semiconductor optical element 134. Therefore, the integrated optical device 110 has a butt joint structure. Further, a III-V compound semiconductor layer 118 containing Al element is provided between the substrate 16 and semiconductor optical element 134. Electrodes E1 and E2 are each provided on the semiconductor optical element 134 and semiconductor optical element 152. Electrode E3 is provided on the underside of the substrate 16.

The semiconductor optical element 134 comprises an optical confinement layer 120, active layer 26, optical confinement layer 128, cladding layer 130, and cap layer 32 which are sequentially provided on the III-V compound semiconductor layer 118. The semiconductor optical element 134 is preferably a semiconductor laser, optical amplifier, or optical modulator. In this embodiment, the semiconductor optical element 134 is a DFB semiconductor laser.

The optical confinement layers 120 and 128 preferably include those with the same structure as that of the optical confinement layers 20 and 28. Further, the cladding layer 130 includes one with the same structure as that of the cladding layer 30.

The semiconductor optical element 152 comprises a buffer layer 136, optical confinement layer 38, active layer 44, optical confinement layer 46, cladding layer 48, and cap layer 50, which are sequentially provided on substrate 16. The semiconductor optical element 152 is preferably a semiconductor laser, optical amplifier, or optical modulator. The semiconductor optical element 152 of this embodiment is an EA optical modulator. Further, the buffer layer 136 preferably includes one with the same structure as that of the buffer layer 36.

The constituent material of the III-V compound semiconductor layer 118 differs from the constituent material of the optical confinement layer 120. The III-V compound semiconductor layer 118 includes one with the same structure as the III-V compound semiconductor layer 18. In this embodiment, a diffraction grating 118a is provided in the III-V compound semiconductor layer 118. The diffraction grating 118a is provided between the III-V compound semiconductor layer 118 and optical confinement layer 120. In an example, the cycle of the diffraction grating 118a is 242 nm. Further, a side etch SE is formed if necessary in the III-V compound semiconductor layer 118.

As mentioned earlier, the integrated optical device 110 comprises III-V compound semiconductor layer 118 which is provided on the diffraction grating 118a and which contains Al element. When the integrated optical device 110 is fabricated, the height position of the semiconductor optical element 152 is easily matched to the height position of the semiconductor optical element 134. Accordingly, the optical coupling efficiency between the semiconductor optical element 134 and semiconductor optical element 152 can be improved.

In addition, in cases where the III-V compound semiconductor layer 118 is $In_xAl_{1-x}As$ and where the optical confinement layer 128 consists of InP material, the refractive index of the III-V compound semiconductor layer 118 is smaller than the refractive index of the optical confinement layer 128. As a result, because there is a large difference between the refractive index of the III-V compound semiconductor layer 118 and the refractive index of the optical confinement layer 128, the diffraction efficiency of the diffraction grating 118a can be increased.

Figure 6:
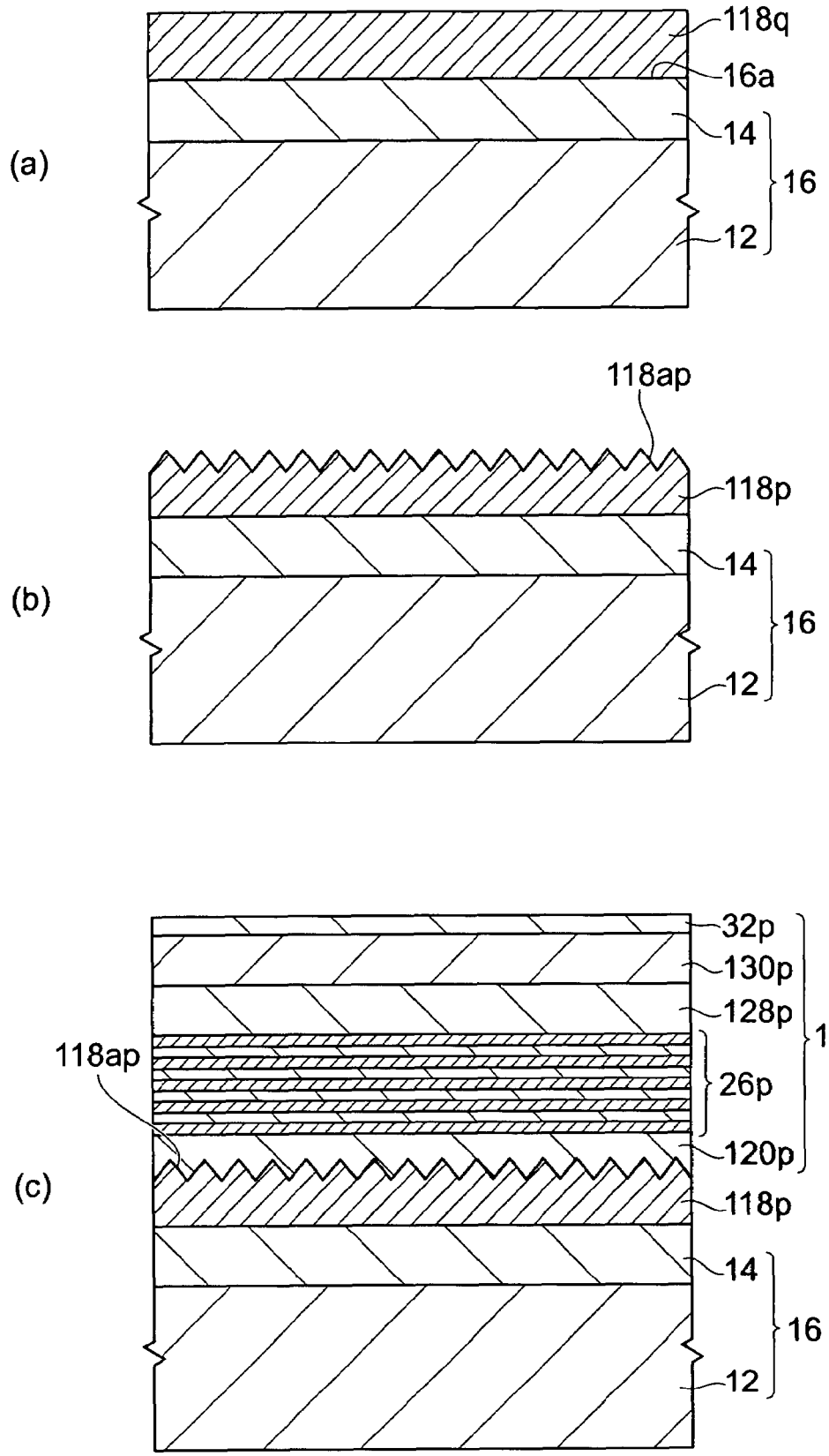
FIG. 6 is a cross-sectional view that schematically shows the respective steps of a method of fabricating an integrated optical device according to the second embodiment.
Figure 7:
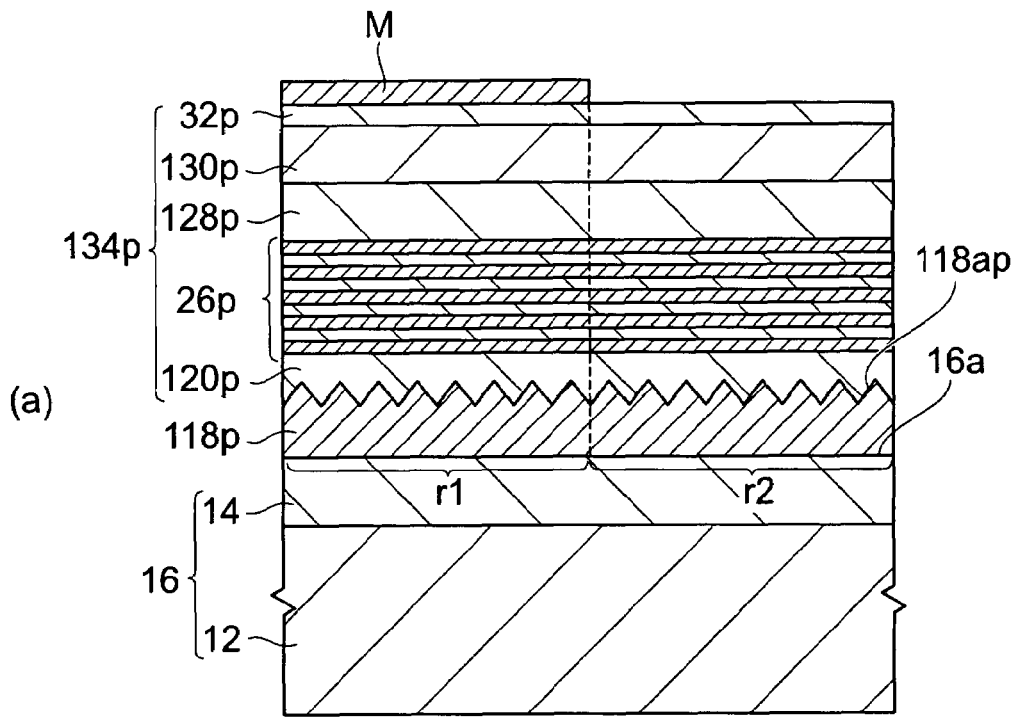
FIG. 7 is a cross-sectional view that schematically shows the respective steps of a method of fabricating an integrated optical device according to the second embodiment.
Figure 7:
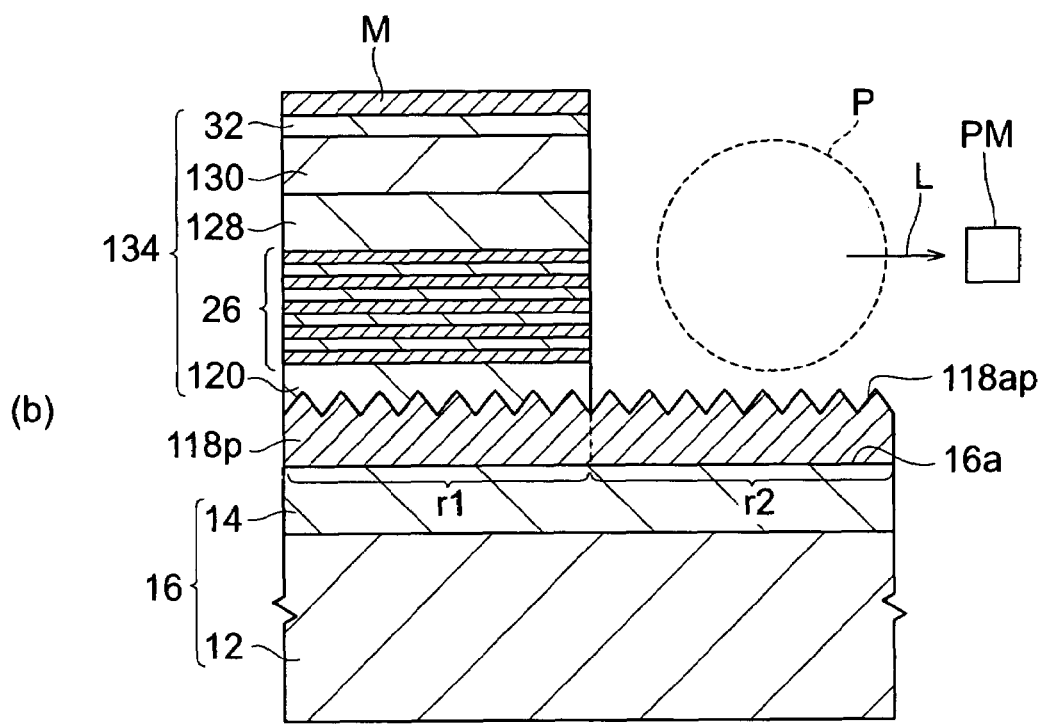
Figure 8:
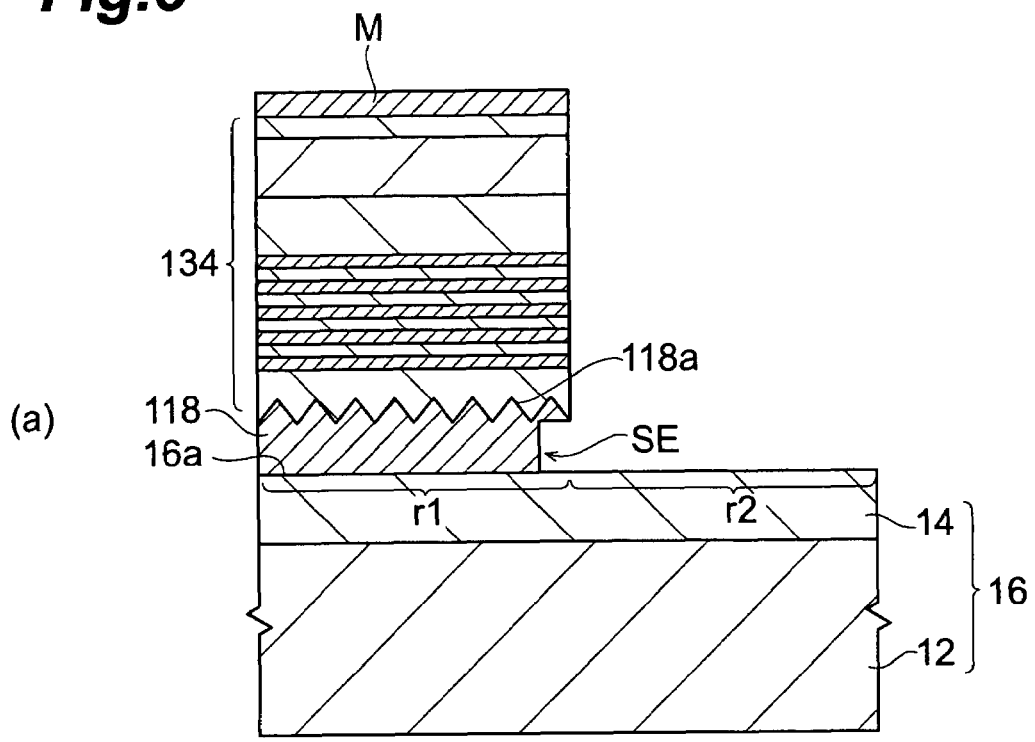
FIG. 8 is a cross-sectional view that schematically shows the respective steps of a method of fabricating an integrated optical device according to the second embodiment.
Figure 8:
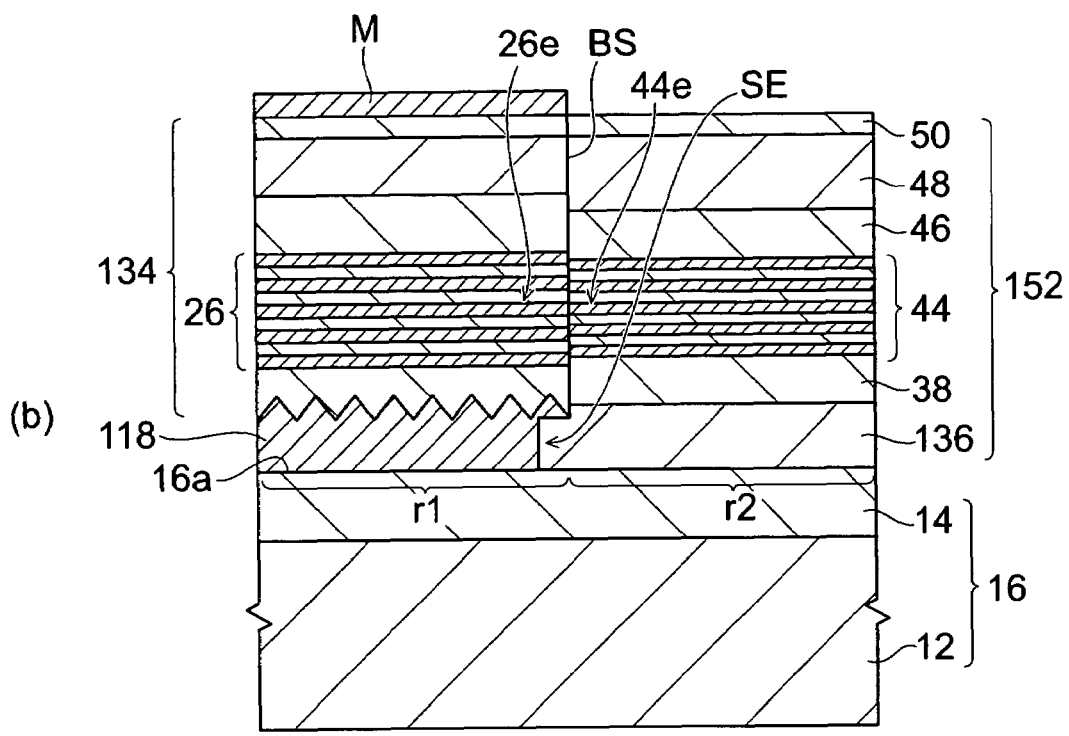

FIGS. 6 to 8 are all cross-sectional views that schematically show the respective steps of the method of fabricating the integrated optical device according to the second embodiment. As an example of the method of fabricating the integrated optical device according to this embodiment, the fabrication method for the integrated optical device 110 will be described hereinbelow. The integrated optical device 110 is suitably fabricated by working through each of the following steps.

First, as shown in (a) and (b) of FIG. 6, a first III-V compound semiconductor layer 118p is formed on the main face 16a of the substrate 16. A diffraction grating 118ap for forming the above diffraction grating 118a is provided on the III-V compound semiconductor layer 118p. The III-V compound semiconductor layer 118p is for forming the III-V compound semiconductor layer 118. The III-V compound semiconductor layer 118p is formed as follows, for example. First, as shown in (a) of FIG. 6, the III-V compound semiconductor layer 118q is formed on the main face 16a of the substrate 16. Thereafter, as shown in (b) of FIG. 6, the III-V compound semiconductor layer 118p on which the diffraction grating 118ap is provided is formed by etching the main surface of the III-V compound semiconductor layer 118q. The III-V compound semiconductor layer 118p is preferably grown epitaxially by using the vapor growth method.

Thereafter, as shown in (c) of FIG. 6, a second III-V compound semiconductor layer 134p for forming a semiconductor optical element 134 is formed on the III-V compound semiconductor layer 118p. The constituent element of the III-V compound semiconductor layer 134p differs from the constituent element of the III-V compound semiconductor layer 118p. The III-V compound semiconductor layer 134p is preferably grown epitaxially by using the vapor growth method. The III-V compound semiconductor layer 134p is formed as follows, for example. The III-V compound semiconductor layer 120p, III-V compound semiconductor layer 26p, III-V compound semiconductor layer 128p, III-V compound semiconductor layer 130p, and III-V compound semiconductor layer 32p are sequentially formed on the III-V compound semiconductor layer 118p. The III-V compound semiconductor layer 120p, III-V compound semiconductor layer 128p, and III-V compound semiconductor layer 130p each form the earlier mentioned optical confinement layer 120, optical confinement layer 128, and cladding layer 130.

Thereafter, as shown in (a) of FIG. 7, etching mask M is formed on the first region r1 of the main face 16a of substrate 16. The etching mask M is formed on the III-V compound semiconductor layer 134p.

Subsequently, as shown in (b) of FIG. 7, the semiconductor optical element 134 is formed by using plasma P to dry-etch the III-V compound semiconductor layer 134p by using etching mask M. The dry etching is preferably reactive ion etching. Gases that can be suitably used as the etching gas include a gas mixture of $CH_4$ gas and $H_2$ gas, or HBr gas, for example. When HBr gas is used, because the GaInAsP is selectively dry-etched with respect to InAlAs, the III-V compound semiconductor layer 118p can be made the etching stop layer.

In this step, the end point of the dry etching is detected by dry-etching while detecting Al element in the plasma P. More specifically, the luminescence L of the plasma P is preferably dispersed by means of a plasma monitor PM and Al element is preferably detected by using the plasma emission spectra thus obtained. For example, when Al element is detected, it can be judged that the end point of the dry etching has been reached. By using the plasma emission spectra, Al element can be detected without affecting the plasma state during dry etching.

Thereafter, as shown in (a) of FIG. 8, the III-V compound semiconductor layer 118p is preferably etched by using the etching mask M. As a result, the III-V compound semiconductor layer 118 is formed. The III-V compound semiconductor layer 118p is preferably wet-etched. In this case, the damaged region of the III-V compound semiconductor layer 118p formed by dry etching, for example, can be removed and the III-V compound semiconductor layer 118p can be etched so that the main face 16a of the substrate 16 is not damaged. As a result, the crystallinity of the constituent material of the semiconductor optical element 152 formed in the second semiconductor optical element formation step (described subsequently) can be improved.

In addition, the side etch SE is preferably formed in the III-V compound semiconductor layer 118p. The side etch SE is suitably formed by overetching when the III-V compound semiconductor layer 118p is wet-etched.

Thereafter, as shown in (b) of FIG. 8, the semiconductor optical element 152 is formed on second region r2 of the main face 16a of the substrate 16. The semiconductor optical element 152 is formed as follows, for example. Buffer 136, optical confinement layer 38, active layer 44, optical confinement layer 46, cladding layer 48, and cap layer 50 are sequentially formed on the second region r2. The buffer layer 136 is preferably grown epitaxially by using the vapor growth method.

Thereafter, after the etching mask M is removed through detachment, electrodes E1 and E2 are each formed on the semiconductor optical element 134 and semiconductor optical element 152 respectively. In addition, electrode E3 is formed on the underside of substrate 16.

As mentioned hereinabove, the integrated optical device 110 is fabricated. In the method of fabricating this embodiment, because the III-V compound semiconductor layer 118p contains Al element, the endpoint of the etching can be detected by detecting Al element when etching the III-V compound semiconductor layer 134p. In addition, in cases where the III-V compound semiconductor layer 134p is grown using the MOVPE method, the thickness of the III-V compound semiconductor layer 134p can be controlled highly accurately and, therefore, the etching depth can be controlled very accurately. When the etching depth can be controlled, because the fluctuations in the etching depth between lots can be reduced when fabricating the integrated optical device 110, the fabrication yield can be improved.

In addition, when the fabrication method of this embodiment is used, the optical coupling efficiency between the semiconductor optical element 134 and semiconductor optical element 152 can be improved, whereby an integrated optical device 110 of a high coupling efficiency is obtained, as per the first embodiment. Furthermore, because there is no need to perform level difference measurement before forming the semiconductor optical element 152, the fabrication steps of the integrated optical device 110 can be simplified and fabrication costs can be reduced.

In addition, the etching depth can be controlled by using etching mask M to etch the III-V compound semiconductor layer 118p. Furthermore, damage to the main face 16a of the substrate 16 can be suppressed by wet-etching the III-V compound semiconductor layer 118p.

In addition, substrate 16 preferably contains InP and the III-V compound semiconductor layer 118p preferably contains $In_xAl_{1-x}As$ ($0 \leq x \leq 1$). In this case, when etching the III-V compound semiconductor layer 118p, the III-V compound semiconductor layer 118p can be selectively etched by using etchant of a high selectivity (the ratio between the etching speed of InP and etching speed of $In_xAl_{1-x}As$). Hence, the III-V compound semiconductor layer 118p can be removed without etching as far as the substrate 16 even when the etching time is strictly managed. Such etchants include citric acid, for example.

In this embodiment, the side etch SE is formed in the III-V compound semiconductor layer 118p in the etching step. Hence, when the semiconductor optical element 152 is formed, the anomalous growth of crystals, in which the end portion 44e of the active layer 44 of the semiconductor optical element 152 bends upward higher than the end portion 26e of the active layer 26 of the semiconductor optical element 134 along the interface BS between the semiconductor optical element 134 and semiconductor optical element 152, can be suppressed. As a result, because the end portion 44e of the active layer 44 of the semiconductor optical element 152 is suitably connected to the end portion 26e of the active layer 26 of the semiconductor optical element 134, the coupling efficiency improves.

In addition, a diffraction grating 118ap is provided on the III-V compound semiconductor layer 118p in this embodiment. In this case, because the diffraction grating 118ap is formed over the whole of the main face 16a of the substrate 16, the selective growth of the etching mask and III-V compound semiconductor layer 118p is not required. In addition, because the diffraction grating 118ap is formed before forming the semiconductor optical element 134, there is no need to remove, through detachment, the semiconductor optical element 134 even in cases where the formation of the diffraction grating 118ap fails. Furthermore, when the diffraction grating 118ap is formed before forming the semiconductor optical element 134, the etching depth when etching the III-V compound semiconductor layer 134p can be easily controlled.

As described hereinabove, the present invention is able to provide an integrated optical device fabrication method capable of controlling the etching depth as well as an integrated optical device of high coupling efficiency.

Preferred embodiments of the present invention were described in detail hereinabove. However, the present invention is not limited to the above embodiment.

For example, one of the semiconductor optical elements 34 and 52 may be a semiconductor laser while the other may be an optical amplifier. One of the semiconductor optical elements 34 and 52 may also be an optical modulator while the other is an optical amplifier.

In addition, a diffraction grating may also be provided in the III-V compound semiconductor layer 18 in the integrated optical device 10 and a side etch may also be formed in the III-V compound semiconductor layer 18. Moreover, the side etch SE need not be formed in the integrated optical device 110.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A fabrication method for an integrated optical device having a first semiconductor optical element that is provided on a first region of a main face of a substrate and a second semiconductor optical element that is provided on a second region of the main face of the substrate and that is optically coupled to the first semiconductor optical element, comprising the steps of:
    forming a first III-V compound semiconductor layer containing an Al element on the main face of the substrate;
    forming a second III-V compound semiconductor layer for forming the first semiconductor optical element on the first III-V compound semiconductor layer;
    forming an etching mask on the first region after forming the second III-V compound semiconductor layer;
    forming the first semiconductor optical element by using the etching mask to dry-etch the second III-V compound semiconductor layer; and
    forming the second semiconductor optical element on the second region after forming the first semiconductor optical element,
    wherein, in the step of forming the first semiconductor optical element, an end point of dry etching is detected by performing dry etching while detecting the Al element.

2. The integrated optical device fabrication method according to claim 1, wherein the Al element is detected by using a plasma emission spectra in the step of forming the first semiconductor optical element.

3. The integrated optical device fabrication method according to claim 1, further comprising a step of wet-etching the first III-V compound semiconductor layer using the etching mask before forming the second semiconductor optical element and after forming the first semiconductor optical element.

4. The integrated optical device fabrication method according to claim 3, wherein, in the step of wet-etching the first III-V compound semiconductor layer, a side etch is formed in the first III-V compound semiconductor layer.

5. The integrated optical device fabrication method according to claim 1, wherein the substrate contains InP, and the first III-V compound semiconductor layer contains $In_xAl_{1-x}As$ ($0 \leq x \leq 1$).

* * * * *